United States Patent [19]
Lai

[11] Patent Number: 5,593,551
[45] Date of Patent: Jan. 14, 1997

[54] MAGNETRON SPUTTERING SOURCE FOR LOW PRESSURE OPERATION

[75] Inventor: Kwok F. Lai, Palo Alto, Calif.

[73] Assignee: Varian Associates, Inc., Palo Alto, Calif.

[21] Appl. No.: 396,366

[22] Filed: Feb. 28, 1995

Related U.S. Application Data

[63] Continuation of Ser. No. 58,153, May 5, 1993, abandoned.

[51] Int. Cl.$^6$ ........................................... C23C 14/34
[52] U.S. Cl. ................................ 204/192.12; 204/298.2; 204/298.18; 204/298.19
[58] Field of Search ................. 204/192.12, 298.16, 204/298.18, 298.19, 298.2

[56] References Cited

U.S. PATENT DOCUMENTS

| | | | |
|---|---|---|---|
| 3,956,093 | 5/1979 | McLeod | 204/192 |
| 4,046,660 | 9/1977 | Fraser | 204/192 |
| 4,404,077 | 9/1983 | Fournier | 204/192 |
| 4,721,553 | 1/1988 | Salto et al. | 204/192 |
| 4,747,926 | 5/1988 | Shimizu et al. | 204/298.12 |
| 4,774,437 | 9/1988 | Helmer et al. | 315/111.81 |
| 4,784,739 | 11/1988 | Kadokura et al. | 204/192 |
| 4,880,515 | 11/1989 | Yoshikawa et al. | 204/192 |
| 4,995,958 | 2/1991 | Anderson et al. | 204/298.2 |
| 5,006,219 | 4/1991 | Latz et al. | 204/298.16 |

(List continued on next page.)

FOREIGN PATENT DOCUMENTS

| | | | |
|---|---|---|---|
| 57-207173 | 12/1982 | Japan | C23C 15/00 |
| 62-167877 | 7/1987 | Japan | C23C 14/36 |
| 03-115567 | 5/1991 | Japan | C23C 14/35 |

OTHER PUBLICATIONS

S. Kadlec et al., entitled "Optimized Magnetic Field Shape for Low Pressure Magnetron Sputtering", pubished in *J. Vac. Sci. Technol. A 13(2)*, on (Mar./Apr. 1995) pp. 389–393.

Article by B. Window et al., entitled "Ion–assisting magnetron sources: Principles and uses", published in *American Vacuum Society* on May/Jun. 1990, pp. 1277–1283.

Article by J. Musil et al., entitled "Unbalanced magnetrons and new sputtering systems with enhanced plasma ionization", published in *American Vacuum Society* on May/Jun. 1991, pp. 1171–1177.

Article by G. A. Clarke et al., entitled "Magnetic field and substrate position effects on the ion/deposition flux ration in magnetron sputtering", published in *American Vacuum Society* on May/Jun. 1991, pp. 1166–1170.

Article by S. Kadlec et al., entitled "Sputtering systems with magnetically enhanced ionization for ion plating of TiN films", published in *American Vacuum Society* on May/Jun. 1990, pp. 1318–1324.

Article by L. Kostadinov et al., entitled "A low working pressure magnetron sputtering source", published in *Vacuum* vol. 42, 1991, Nos. 1/2, pp. 35 to 37.

Article by W. Posadowski, entitled "Low Pressure Magnetron Sputtering Using Ionized, Sputtered Species", presented at the International Conference on Metallurgical Coatings and Thin Films, San Diego, Apr. 22–26, 1991.

Article by T. Asamaki et al., entitled "High–vacuum planar magnetron discharge", published in *American Vacuum Society* on Nov./Dec. 1992, pp. 3430–3433.

Article by J. J. Cuomo et al., entitled "Hollow–cathode–enhanced magnetron sputtering", published in *J. Vac. Sci. Technol.*, vol. 4, No. 3, pp. 393–396.

*Primary Examiner*—Nam Nguyen
*Attorney, Agent, or Firm*—David Schnapf

[57] ABSTRACT

A magnetron sputtering source which is capable of very low pressure operation is disclosed. The source comprises a dish-shaped sputter target behind which is mounted a primary magnet for confining a plasma discharge adjacent to the front surface of the sputter target. A bucking magnet, positioned adjacent to the perimeter of the sputter target and, preferably, at the same level as the target, is used to prevent the magnetic field created by the primary magnet from spreading out at near the edge of the sputter target. This enables the source to operate at very low pressure and reduces the impedance of the discharge.

12 Claims, 6 Drawing Sheets

U.S. PATENT DOCUMENTS

| | | | |
|---|---|---|---|
| 5,085,755 | 2/1992 | Setoyama et al. | 204/298.16 |
| 5,122,252 | 6/1992 | Latz et al. | 204/298.26 |
| 5,171,415 | 12/1992 | Miller et al. | 204/298.2 X |
| 5,178,739 | 1/1993 | Barnes et al. | 204/192.12 |
| 5,196,105 | 3/1993 | Feuerstein | 204/298.19 |
| 5,252,194 | 10/1993 | Demaray et al. | 204/298.2 |
| 5,318,923 | 6/1994 | Park | 437/188 |
| 5,330,628 | 7/1994 | Demaray et al. | 204/192.12 |
| 5,401,675 | 3/1995 | Lee et al. | 437/192 |

MAGNETRON SPUTTERING SOURCE FOR LOW PRESSURE OPERATION

RELATED U.S. APPLICATIONS

This is a continuation of Ser. No. 08/058,153, originally filed on May 5, 1993 abandoned.

FIELD OF THE INVENTION

This application relates to sputtering sources for depositing thin films on substrates, such as semiconductor wafers, and is particularly related to magnetron sputtering sources capable of very low pressure operation.

BACKGROUND OF THE INVENTION

Magnetron sputtering is a well-known method of physical vapor deposition for forming thin films on substrates of various sorts. Sputtering is the technique of choice for depositing many types of films onto to semiconductor waters in the fabrication of semiconductor devices such as integrated circuit "chips." The technique has become particularly widespread in semiconductor fabrication for the deposition of metallization layers of aluminum. Magnetron sputtering is also frequently used to deposit films of other materials onto semiconductor wafers, including, for example, films of titanium nitride, titanium, titanium/tungsten alloy and various precious metals.

As semiconductor device geometries have shrunk, and the density of device components has increased, the demands on sputtering systems have commensurately increased. The typical specifications for sputtered films include such properties as the overall uniformity of the deposited layer, step-coverage (i.e., the ability to cover irregular features on the substrate such as "steps"), and the ability to fill very narrow grooves (trenches) and interconnect vias. The typical specifications for each of these film properties are now substantially greater than they were just a few years ago, and it is expected that this trend will continue as device makers develop new generations of devices. At the same time, the semiconductor wafers used in device fabrication have grown in size, so that wafers having an eight-inch diameter are now common. The increase in wafer size magnifies the difficulty associated with attaining increasingly demanding film specifications across the entire surface of the wafer. For example, achieving film uniformity over an eight-inch wafer is substantially more difficult than achieving the same degree of uniformity over a six-inch wafer.

In magnetron sputtering a plasma is created within a vacuum chamber adjacent to the surface of a sputter target comprising a material to be sputtered. The plasma is formed in a support gas, such as argon, which is introduced at low pressure into the vacuum chamber. (If reactive sputtering is to be performed a reactive gas is also introduced into the chamber.) An electrical potential is created within the vacuum chamber between the sputter target, which typically serves as the cathode of the sputtering system, and an anode. The electrical field causes the support gas to be ionized thereby forming a plasma. A magnetic field is provided to confine the discharge, usually by a magnet system that produces field lines that loop through the surface of the target cathode. The magnetic field traps electrons, increasing the number of collisions between the electrons and the support gas atoms, thereby increasing the ion population and intensifying the plasma.

The positive ions in the plasma are attracted to the sputter target surface which, as noted above, acts as the cathode in the system. Collisions between the positive ions and the surface of the target cause the target material to be ejected from the surface. The ejected atoms travel through the vacuum chamber and a portion of them impinge on the surface of the substrate forming a film.

In order to meet the present and anticipated specifications for sputtered films used in the manufacture of semiconductor devices, a variety of improvements to the basic magnetron sputtering system have been proposed and implemented. These include the use of closed-loop rotating magnet arrays to improve sputtered film uniformity and target utilization, and the use of collimating filters to improve the filling of small diameter vias and narrow grooves.

Closed-loop rotating magnet arrays are used to create a closed-loop magnetic tunnel to confine a plasma which is swept across the face of the sputter target as the magnet is rotated. Examples of such systems are described in U.S. Pat. No. 4,995,958 and U.S. Pat. No. 5,252,194, coassigned herewith, the disclosures of which are incorporated herein by reference. Briefly, the '958 patent teaches how to construct a generally heart-shaped, closed-loop magnet to create an arbitrarily determined erosion profile (for example, uniform erosion), over a large portion of the sputter target, and Ser. No. '251 extends the teachings of the '958 patent to obtain uniform erosion in the central portion of the sputter target. The teachings of these extend to targets that are dish-shaped. For purposes of the present disclosure it is intended that the term "dish-shaped" include planar, convex and concave shapes, or combinations thereof.

An example of a sputtering system comprising a collimation filter is found in U.S. Pat. No. 5,330,628, coassigned herewith, the disclosure of which is incorporated herein by reference. As described in that application, a collimation filter may be used to limit the angles of incidence of sputtered atoms which impinge upon the surface of the substrate. By limiting the angles of incidence it is possible to promote deposition on the bottom and side walls of, for example, a small diameter via. With the apparatus and method taught in the '212 application, sputtering has been successfully used to deposit high quality films into vias having diameters less than 0.5 μm.

Use of a collimation filter requires that the sputter source have highly uniform emission characteristics. Thus, collimation was not a practical technique until a sputter source with suitably uniform emission characteristics was available, such as the sputter source described in the aforementioned patent application Ser. No. 07/471,251. Moreover, collimation requires the use of relatively low pressure sputtering because the scattering that occurs at normal sputtering pressures tends to negate the effects of the filter, i.e., at normal sputtering pressures a substantial number of atoms are scattered after they have passed through the filter, losing the directionality imparted by the collimator.

Aside from the need to operate a collimated sputtering system at low pressure to avoid gas scattering, there are several other advantages of low pressure sputtering as described below.

A typical magnetron sputtering source has a minimum pressure at which a plasma discharge will be initiated, and a lower minimum operating pressure. Nonetheless, as a practical matter for commercial embodiments, the magnetron is always operated above the ignition pressure. This is to protect the system in case the plasma should go out for extraneous reasons. In theory, after a stable plasma discharge is initiated, the operating pressure may be lowered, so long as it does not fall below the minimum operating pressure. However, in a commercial environment, the risk of plasma extinguishment, with the attendant disruption of operation and possible damage to the wafers being processed, is too great.

The inventor has observed that the plasma above a dish-shaped target with a closed-loop magnet behind it tends to spread out as the operating pressure of the sputtering chamber is lowered. The area of the target which contacts the plasma is sometimes referred to as the discharge track, and this discharge track tends to widen as the pressure drops. It is postulated that this occurs as the electrons in the plasma move to higher orbits in the magnetic field. When the edge of the discharge track extends beyond the edge of the target the plasma discharge "goes out." (More precisely, the plasma does not entirely extinguish, but rather it is transformed into a low level Penning discharge. The intensity of this Penning discharge is too low to provide a useful deposition rate.)

From the above observations, it appears that one method of lowering the pressure at which the plasma in a given chamber will extinguish is to simply employ a larger sputter target, such that the edge of the discharge track is able to "spread out" more before it reaches the edge of the target. This is not a very satisfactory solution for at least two reasons. First, employing a larger sputter target will result in less efficient target usage. Since sputter targets can be quite expensive, every effort is normally made to maximize efficiency of use, consistent with the ability to meet sputtered film specifications. Second, the diameter of the sputter target, which is typically wider than the wafer undergoing processing, usually determines the width of the vacuum chamber. For example, in commercial sputtering systems sold by the assignee of the present invention, a target less than twelve inches in diameter is used with eight-inch diameter wafers. Use of a significantly larger target would require that the sputtering chamber be enlarged. This is undesirable for several reasons including added manufacturing expense, greater pump down times (or larger pumps) and larger overall system size.

Several other techniques have been used to reduce the operating pressure of a sputtering system. One such technique is to use a hollow cathode discharge to assist the magnetron discharge. The hollow cathode technique has the added advantage of operating at relatively low voltages. However, in known prior art systems, the hollow cathode is operated within the magnetic field of the magnetron and is coated during system operation. This will eventually lead to particulate problems as flaking off of the hollow cathode occurs, or will dictate frequent hollow cathode cleaning, with a resulting disruption of system usage. In addition, known hollow cathode systems lack cylindrical symmetry, resulting in non-uniform coatings when operating at higher pressures or with larger magnetrons.

Another very new technique is to operate a sputtering source without a support gas at very high power density to achieve self-sustained sputtering. In this technique, the atoms of sputtered material become ionized and sustain the plasma. This technique that appears to be restricted to a limited range of materials, such as silver, gold and copper, which have self-sputtering yields greater than unity. Because of the very high power densities needed to achieve self-sputtering, it is quite difficult to adjust the deposition rate, which is an important process parameter. (It is noted that a support gas at relatively high pressure is still needed to strike the discharge, before going to low pressure operation.)

Yet another technique employs an anti-cathode to achieve low pressure operation. This method prolongs the time that ions stay in the discharge region by using a minimum B magnetic field configuration and electrostatic confinement of ions by means of a virtual cathode. Known embodiments of this type of system result in intense ion bombardment of the substrate, which is undesirable in most semiconductor applications in view of the high risk of damage to devices that have already been formed on the wafer. Moreover, the magnetic geometry used in known anti-cathode systems is likely to result in films which are not highly uniform.

Finally, low pressure sputtering can be accomplished using multipolar magnetic plasma confinement to enhance gas ionization. This technique also may cause unacceptably high ion bombardment of the substrate and is highly sensitive to the relative positions of the magnetron and the multipolar magnets making it difficult to reliably duplicate process results.

Another problem with some of the above solutions to low-pressure sputtering is that the systems do not operate efficiently over a wide range of pressures. While some may function well at very low pressure, they do not work well when the pressure is raised. On the other hand, the pressure at which a film is deposited can influence the properties of the film. Thus, operating pressure can be used as a variable in optimizing a process to create a film with desired properties. It is, therefore, desirable to have a system that can function not only at very low pressure but over a wide range of pressures.

Finally, it is noted that it is generally desirable to operate sputtering systems at the lowest possible impedance to enhance the efficiency of operation.

SUMMARY OF THE INVENTION

Accordingly, it is an object of the present invention to provide an apparatus and method for low pressure, high-rate, magnetron sputtering.

A further object of the present invention is to provide an apparatus and method for high-rate, low-pressure magnetron sputtering from a dish-shaped sputter target that does not require enlargement of the target, use of hollow cathodes or anti-cathodes, or multipolar magnetic confinement.

Yet another object of the present invention is to provide means in a magnetron sputtering apparatus having a dished-shaped cathode with a closed-loop rotating magnet positioned adjacent the backside thereof, for preventing the spreading of the discharge track beyond the edge of the target as the operating pressure of the sputtering system is reduced.

Still another object of the present invention is to provide a sputtering system which is capable of operating over a range of pressures including low pressure.

A further object of the present invention is to provide a sputtering system have a low plasma impedance.

These and other objects of the present invention, which will become apparent to those skilled in the art upon reading this specification in connection with the accompanying drawings and appended claims, are realized in a novel sputtering apparatus and method wherein the discharge track is confined by a peripheral bucking magnet positioned adjacent to the edge of a dish-shaped sputter target. In its basic form, the present invention comprises a generally dished-shaped sputter target having a front surface comprising a material to be sputtered, a back surface and a perimeter, a primary magnet means positioned proximate said back surface for creating a magnetic tunnel adjacent to said front surface for confining a plasma to a discharge track, and a bucking magnet adjacent to said target perimeter. According to the present invention, the dish-shaped target may be planar, convex, concave, or comprise a combination of these shapes. In the preferred embodiment both the perimeter of the target and the bucking magnet are generally circular. Preferably, the primary magnet means is a heart-shaped, closed-loop magnet that is rotatable about an axis which passes through the sputter target, and which produces a magnetic tunnel of narrow cross-section.

DETAILED DESCRIPTION

Figure 1:
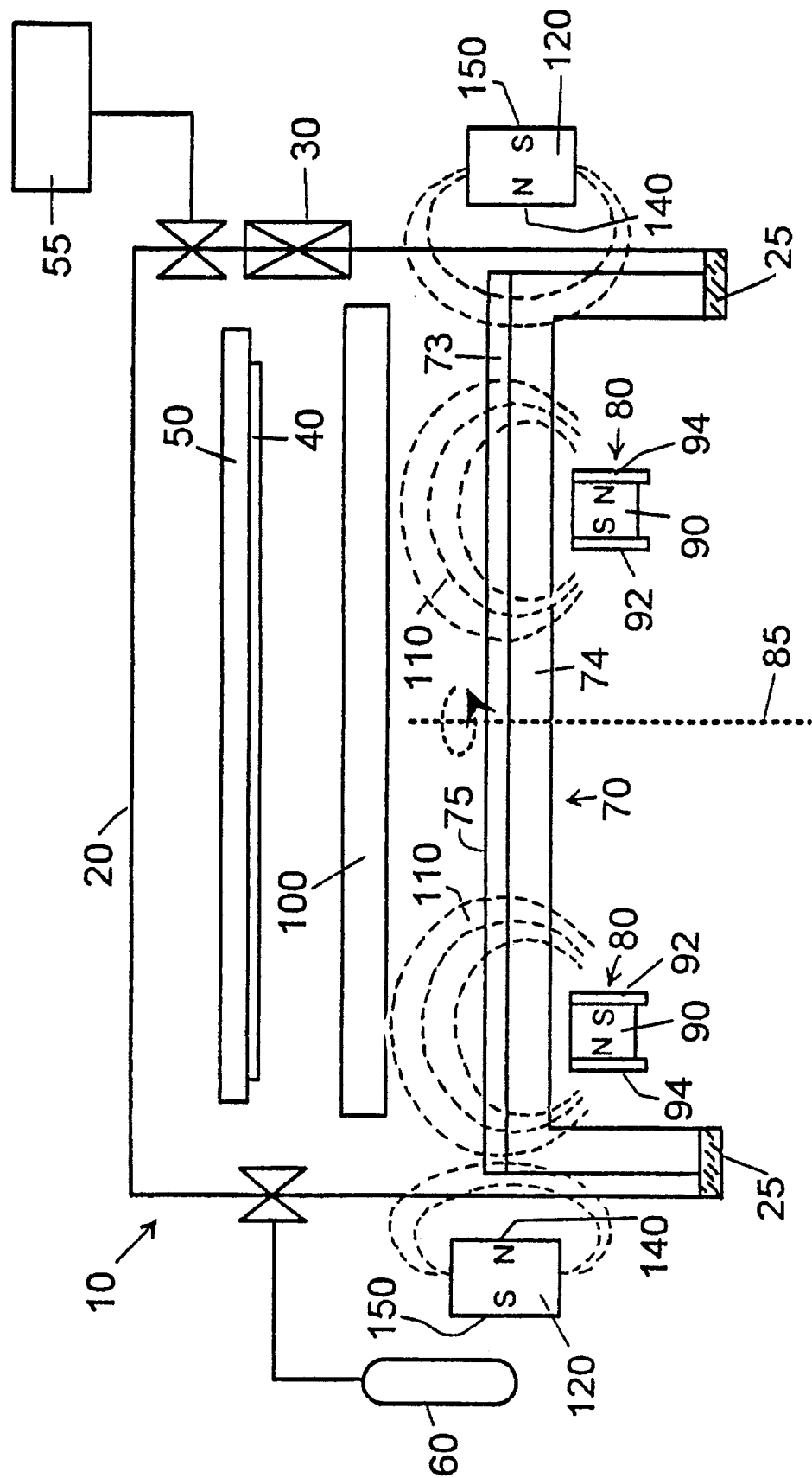
FIG. 1 is a partial cross section of a sputtering chamber according to the present invention.

The present invention employs a bucking magnet to confine the magnetic field created by a primary magnet positioned near the back surface of a dished-shaped sputtering target in a magnetron sputtering chamber. The invention may best be understood by reference to the illustrative embodiment depicted in FIG. 1, to which we now turn. FIG. 1 is a schematic, cross-sectional view of a sputtering chamber 10 according to the present invention. Sputtering chamber 10 comprises a vacuum chamber 20 wherein sputtering is conducted. Vacuum chamber 20 comprises door 30, through which substrates to be coated may be transferred into and out of the sputtering chamber. For purposes of this discussion it will be assumed that the system is used for coating semiconductor wafers, which may have undergone other processing before being sputter coated. A typical wafer 40 is shown positioned on a wafer holding platen or chuck 50. Wafer chuck 50 not only holds wafer 40 in a stationary position while it is being processes in vacuum chamber 20, but may be used to provided temperature control of the water during processing and to electrically bias the wafer, as are well-known in the art.

An externally positioned wafer transfer arm (not shown) may be used to transport wafers into and out of vacuum chamber 20. A load lock (not shown) may be interposed between vacuum chamber 20 and the atmospheric environment so that the entire vacuum chamber need not be exposed to atmospheric pressure each time a wafer is inserted or removed. Again, these features are well-known to those skilled in the art and need not be described in greater detail. Vacuum chamber 20 may be but one module in a larger multi-chamber sputtering system such as the model M-2000™ sputtering system that is sold by the assignee of the present invention. Such a system will also include a computerized control means, various power supplies and controls, and an automated water tracking, loading and transport system.

Vacuum pumping system 55, typically comprising a combination of a mechanical roughing pump for initial pump of the chamber from atmospheric pressure, and a high-vacuum pump (such as a cryopump) for use after initial pump-down, is connected to the vacuum chamber and is used to maintain the chamber at a controlled vacuum level. A source of background gas 60, commonly argon, is connected to chamber 20 to serve as a plasma support gas. When the preferred embodiment of the present invention is operated, the argon pressure is held at between 0.1–4.0 millitorr. If reactive sputtering is to be performed, a source of a reactive gas (not shown), such as nitrogen, is also connected to the chamber. Control means (not shown) for monitoring the pressure within vacuum chamber 20 and for adjusting the flow of argon (and, if applicable, the reactive gas) into the chamber are also provided, as are well-known in the art.

Generally opposing wafer 40 is a dish-shaped sputter target assembly 70 which also serves as the cathode of the system. In a typical embodiment, sputter target assembly 70 will comprise a layer of material 73, such as aluminum or titanium, to be sputtered, which is bonded to a backing plate 74. Backing plate 74 may be water-cooled to provide temperature control of the target. As shown in FIG. 1, the front surface 75 of target assembly 70 may initially be planar. (Of course, the shape of the target surface will change as it is eroded during sputtering.) Other initial surface shapes, such as convex or concave targets, or targets having combinations of planar, concave and convex shapes, are also considered to be within the scope of the present invention. In the preferred embodiment, sputter target assembly 70 is generally circular and has a diameter that is somewhat larger than the diameter of the wafers being coated. For example, when coating eight-inch wafers, target assembly 70 may be between eleven and twelve inches in diameter.

A magnet means 80 is positioned behind the rear surface of backing plate 74. Preferably, magnet means 80 comprises a closed-loop, generally heart-shaped rotating magnet of the type that is disclosed in the aforementioned U.S. Pat. No. 4,995,958 and application Ser. No. 07/471,251. Magnet means 80 is rotatable about axis 85, and comprises an array of individual magnets 90 set between inner and outer closed-loop pole pieces 92, 94, respectively, thereby forming a closed-loop magnetic tunnel 110 about the adjacent areas of the front surface 75 of sputter target assembly 70. The magnet array and pole pieces may be mounted on a turntable (not shown) for rotation.

Magnet means 80 may be configured to provide highly uniform erosion over nearly the entire surface 75 of sputter target assembly 70 when it is rotated. This not only ensures that the material of layer 73, which may be quite valuable, is efficiently utilized, but is also important for assuring that the film deposited on wafer 40 has good film qualities. In particular, the use of a highly uniform emission source is critical if a collimation filter 100 is used. While the use of a collimation filter in connection with the present invention is considered optional, it is noted that the low pressure operation that is made possible by the present invention is particularly important when using a collimation filter.

While magnet means 80 is shown external to vacuum chamber 20, it is also considered within the scope of the present invention to position magnet means 80 within the vacuum chamber. In such a case, backing plate 77 will not form a part of the vacuum enclosure.

As noted, magnet means 80 forms a closed-loop magnetic tunnel 110 adjacent to front surface 75 of sputter target assembly 70. Field lines emanate from one of the magnetic pole pieces, loop through the target, and return to the other pole piece thereby defining the shape of the magnetic tunnel 110.

A second stationary closed loop magnet means 150 is shown in FIG. 1 having an annular configuration about target assembly 70. This magnet means 150 generally may have an upper surface which is coplanar with target surface 75 and an inner edge generally located adjacent to the peripheral edge of target assembly 70, being oriented to have the same magnetic polarity as the outer edge of rotatable magnetic means 80. For example, 140 and 94 both represent north poles and 120 and 92 both represent south poles. It can be seen from FIG. 1 that respective magnet means 80 and 150 cooperate to confine the plasma discharge in a manner governed by the resultant opposing magnetic field lines near the peripheral edge of the target as shown.

To promote clarity, FIG. 1 has been simplified and some well-known features of a typical sputtering system have been omitted. For example, a dark-space shield is normally present near the edge of the sputter target, and various mounting, support, monitoring, electrical connection and cooling means are not shown. It is believed that all of these features are well known to those skilled in the art.

The operation of chamber 10, as described thus far, is well-known. After wafer 40 is positioned on wafer chuck 50, vacuum chamber 20 is pumped down to a high vacuum level. A controlled amount of argon is then introduced into the chamber and a relatively high negative voltage is applied to sputter target assembly 70 which serves as the system cathode. Such a voltage may be of the order of several hundred volts. Typically anode potential is ground, so that the entire vacuum chamber 20, apart from the sputter target assembly 70, serves as the system anode. Insulators 25 isolate sputter target assembly 70 from the remainder of the vacuum chamber. Wafer 40 may be held at ground potential, allowed to "float" electrically, or may be biased slightly negative, depending on the particulars of the specific sputtering process being conducted. When the voltage is applied to the cathode, a plasma discharge is formed near the cathode, and is substantially confined to the closed-loop magnetic tunnel 110 that is generally above the magnet means 80. As is well known, the argon pressure required to "strike" or "ignite" the plasma is greater than the pressure level needed to maintain the plasma discharge. Nonetheless, for the reasons described above, the operating pressure of the chamber is maintained above the ignition pressure after the plasma is formed.

The plasma, which is generally narrowly confined, is swept over substantially the entire surface of the sputter target as the magnet means 80 is rotated about axis 85. As described above, this results in substantially uniform target erosion.

Figure 5A:
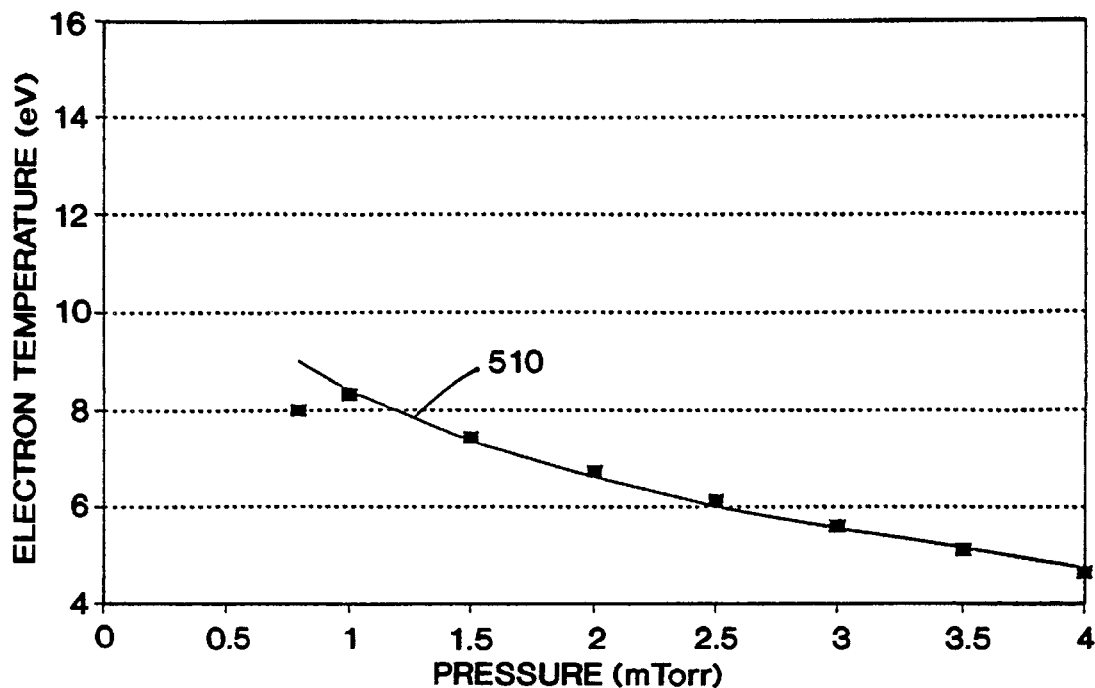
FIGS. 5A and 5B are graphs of electron temperature vs. pressure comparing sputtering systems with and without a bucking magnet according to the present invention.

The inventor has observed that the plasma discharge above the target surface tends to spread out as the operating pressure of the chamber is lowered. It is believed that this spreading out effect is due to the fact that the electrons which are trapped in the magnetic field move to higher orbits in the magnetic field. Eventually, the plasma goes out after the pressure is lowered to the point that the plasma discharge track reaches the edge of the sputter target. In a prior art system of the type sold by the assignee of the present invention, this pressure may be approximately about 1.0 millitorr as shown in FIG. 5A.

Figure 2:
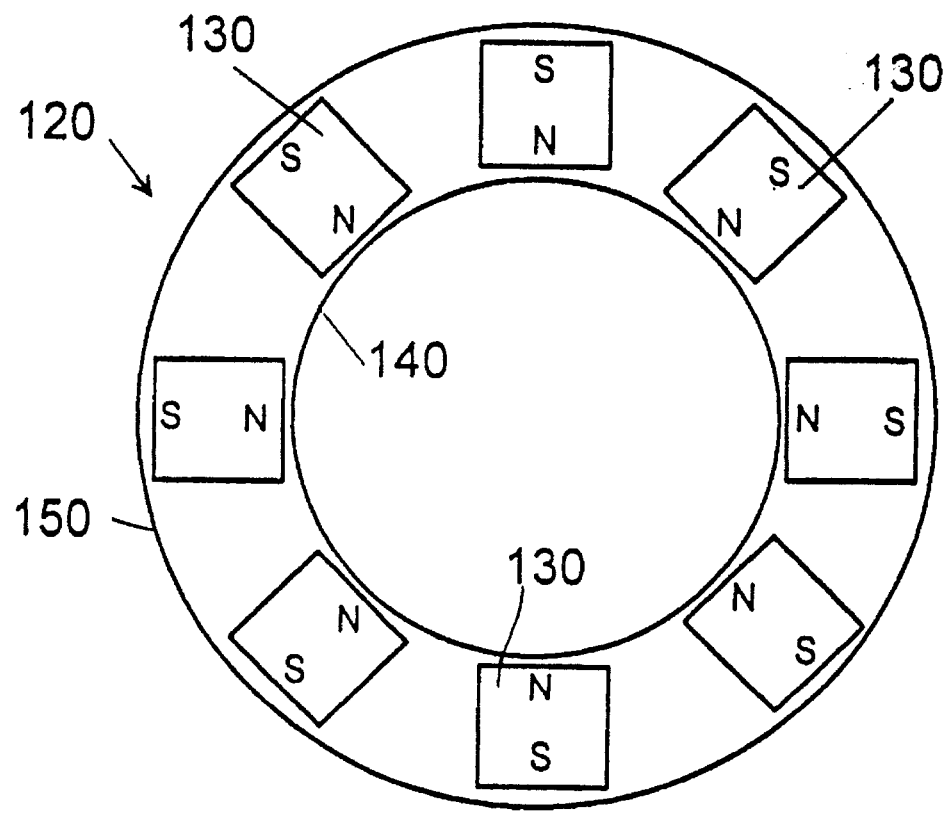
FIG. 2 is a schematic plan view of a bucking magnet array designed for use in the present invention.
Figure 3:
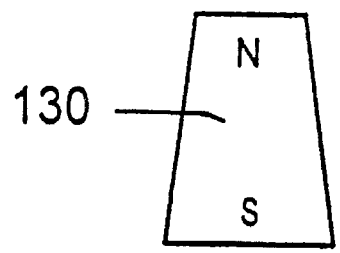
FIG. 3 is plan view of a wedge-shaped magnet for use in the bucking magnet array of the present invention.

For a variety of reasons, it is often desirable to be able to sputter at very low pressure. To this end, the present invention employs bucking magnet means 120 positioned near the periphery of sputter target assembly 70. In one embodiment, bucking magnet means 120 comprises an array of individual, high energy permanent magnets 130 located between inner and outer pole pieces 140 and 150, respectively, as shown in the schematic plan view of FIG. 2. (FIG. 2 shows the bucking magnet of the present invention apart from the rest of the sputtering apparatus.) In another embodiment, the individual magnets 130 of the bucking magnet array are wedge-shaped as shown in FIG. 3. For simplicity, FIG. 2 shows an array of eight magnets. However, in the preferred embodiment of the present invention, the number of magnets used is much greater and, preferably is at least 14–21. This ensures that bucking magnet means 120 produces a field that is sufficiently strong and uniform. Those skilled in the art will understand that the bucking magnet of the present invention need not comprise permanent magnets, and various configurations including electromagnets may also be utilized so long as the resulting magnetic field has the properties required by the present invention.

As depicted in FIGS. 1 and 2, bucking magnet means 120 is generally annular in shape and is positioned around the periphery of sputter target assembly 70. In the preferred embodiment, at least a portion of bucking magnet means 120 generally lies in the plane defined by the outer edge of upper surface 75 of dish-shaped sputter target assembly 70. The polarity of bucking magnet inner pole piece 140 is the same as the polarity of outer pole piece 94 of primary magnet means 80. Thus, the field produced by bucking magnet 120 tend to repel the field produced by primary magnet means 80. This repulsion distorts the field lines of the primary magnet means such that the primary magnetic field is less spread out in the vicinity of the bucking magnet. (See also FIGS. 7A and 7B and related discussion.) In effect, this concentrates the primary magnetic field and prevents the plasma from spreading out toward the edge of the sputter target.

Figure 4:
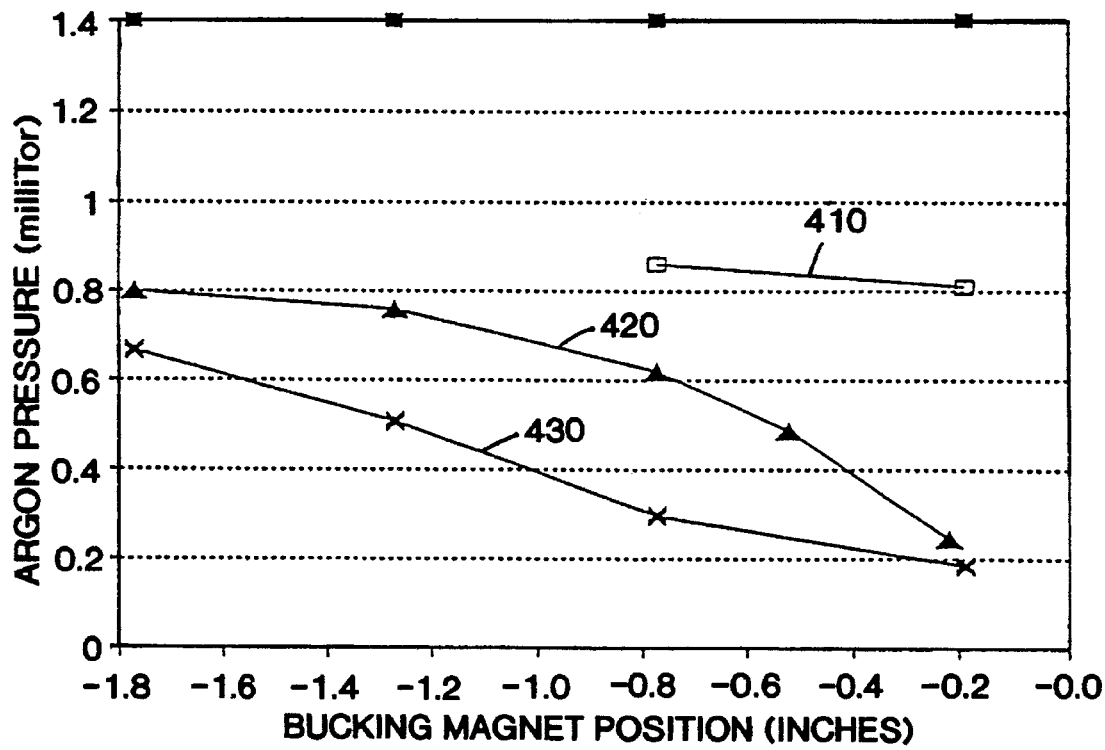
FIG. 4 is a graph of the plasma ignition pressure vs. the position of the bucking magnet relative to the primary magnet.

FIG. 4 is a graph of plasma ignition pressure vs. the position of the bucking magnet relative to the plane defined by the upper surface of the primary magnet. The position indicated along the y-axis of the graph is the vertical position of the bucking magnet, i.e., its position parallel to the axis of rotation of the primary magnet means. Data was collected for three different magnet configurations: a bucking magnet comprising seven (curve 410), fourteen (curve 420) and twenty-one (curve 430) individual magnets, respectively. Only limited data was collected, so that the optimal positioning of the bucking magnet is not clear from this graph. Nonetheless, it is clear that bucking magnet position relative to the primary magnetic field plays an important role in determining the ignition pressure. This data reflects the relation between the ability to prevent the primary magnetic field from spreading and the position of the bucking magnet relative to the primary magnetic field. It should be apparent to those skilled in the art that placement of the bucking magnet too far along the vertical axis away from the primary magnet could produce an effect opposite to what is intended, since distant positioning could cause the primary magnetic field to spread out even more than it would without a bucking magnet.

If it is necessary to place the bucking magnet significantly away from the plane of the target cathode, it is possible to tilt the bucking magnet to compensate for the placement.

The data in FIG. 4 also reflect the advantage of creating a bucking magnet field that is both intense and uniform. Using too few magnets creates gaps in the bucking magnet field and does not adequately confine the plasma.

Figure 7A:
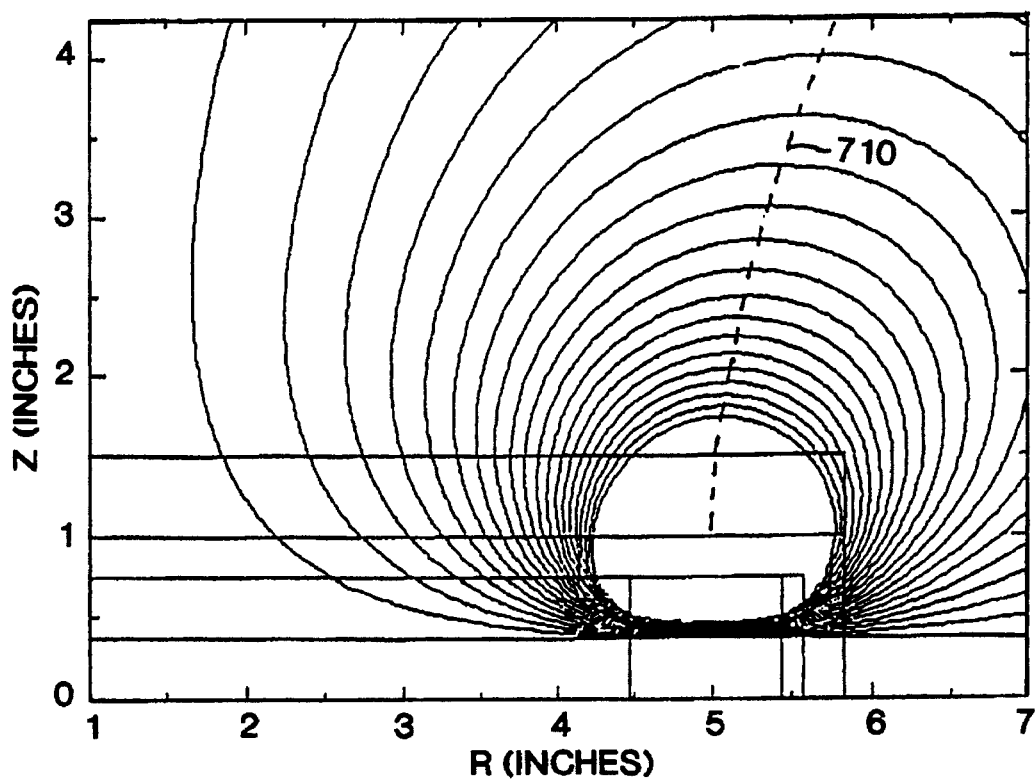
FIGS. 7A and 7B are computer simulations of graphs of the magnetic field lines in the vicinity of the edge of the sputter target with and without the bucking magnet of the present invention.
Figure 7B:
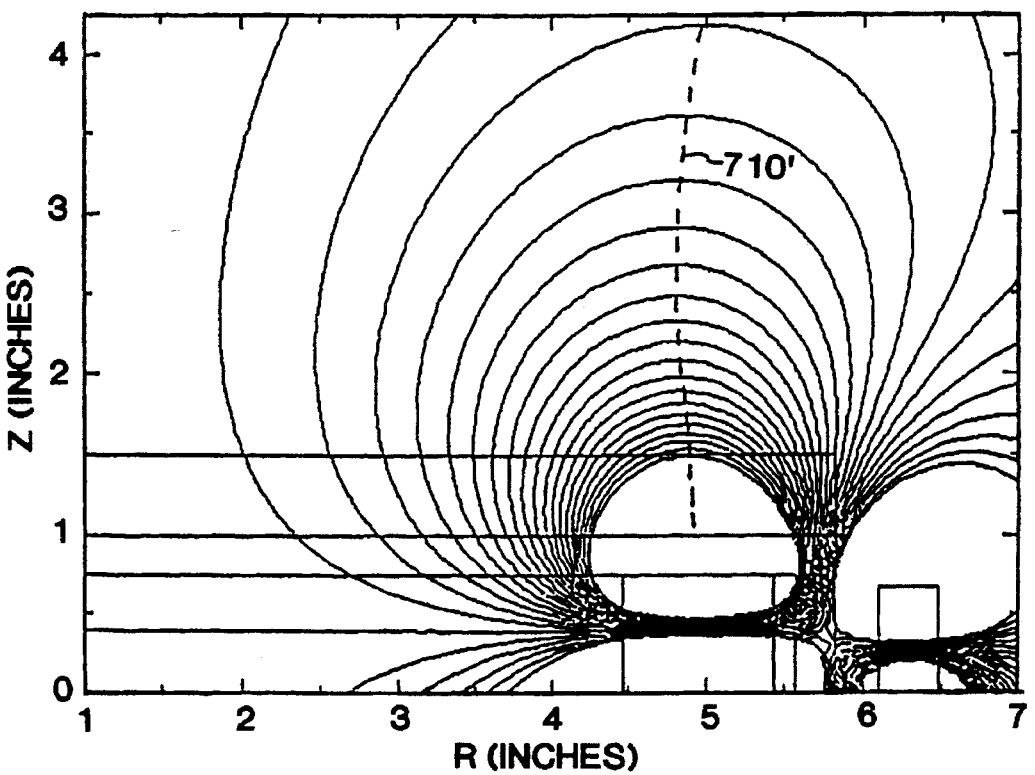

FIGS. 7A and 7B depict the magnetic field lines in the vicinity of the edge of the sputter target. FIG. 7A shows the field lines that are present without a bucking magnet, i.e., in a prior art sputtering system of the type sold commercially by the assignee of the present invention, and FIG. 7B shows the field lines in the same system when the bucking magnet of the present invention is used. The lines depicted were developed using a computer model that is believed to be reasonably accurate. The accuracy of the model has been confirmed by empirical measurement. It is noted that in FIG. 7A only three of the magnetic field lines loop through the surface of the target near the edge thereof, while in FIG. 7B, when a bucking magnet is used, more than a dozen field lines loop through the target edge. Dashed lines 710 and 710', respectively, indicate the position where the magnetic field is parallel to the surface of the sputter target. It will be noted that the position of line 710' (with the bucking magnet) in FIG. 7B is shifted significantly in the direction of the center of the sputter target in relation to the position of line 710 without a bucking magnet.

Apparatus built in accordance with the present invention has been used to ignite a plasma discharge at a pressure of approximately 0.2 millitorr, and has lowered the extinction pressure to below 0.1 millitorr. These numbers represent almost an order of magnitude improvement over the ignition and extinction pressures of a sputtering chamber of the same construction without a bucking magnet. Typical prior art pressures for ignition and extinction in a similar system are around 1.0 and 0.7 millitorr, respectively.

The use of a bucking magnet as contemplated by the present invention, and the low pressure operation that it enables, has several advantages, many of which were not realized until observation of the performance of the present invention.

As noted above, as the pressure in a magnetron sputtering system drops, the plasma adjacent to the surface of a dish-shaped sputter target tends to spread out. Particularly when combined with use of a rotating magnet, this spreading out effect helps to more evenly distribute the plasma over the surface of the target, thereby further enhancing uniformity of erosion. This effect can be particularly significant near the center of a sputter target where achieving uniformity of erosion is most difficult. Thus, the present invention can be used to increase target erosion uniformity. Moreover, the present invention can be used to "fine tune" the erosion profile of a target by adjusting the operating pressure of the system.

Figure 5B:
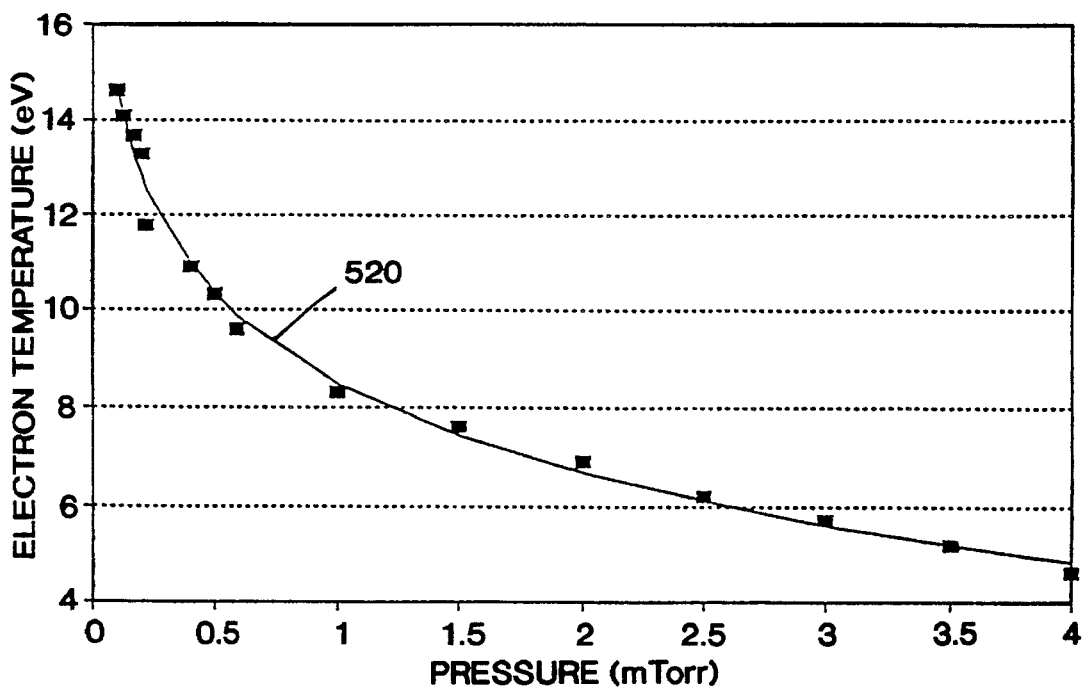

FIGS. 5A and 5B are graphs of electron temperature vs. sputtering pressure, comparing experimental results achieved in sputtering systems with (FIG. 5B, curve 520) and without (FIG. 5A, curve 510) the bucking magnet of the present invention. Initially, it is noted that in the data presented, the lowest pressure achievable without a bucking magnet was just under 1.0 millitorr, while with a bucking magnet an operating pressure of roughly 0.1 millitorr was achieved. While curves 510 and 520 closely coincide with each other in their range of overlap, suggesting that the presence of the bucking magnet itself does not influence the electron temperature within the plasma, the electron temperature rises dramatically in the pressure region between 1.0 and 0.1 millitorr. (This effect was first discovered by observing the optical emission characteristics of various plasmas, and the data which is portrayed in FIGS. 5A and 5B are based on the assumption that there is a linear dependence of the argon neutral density with operating pressure.) The dramatic increase of the electron temperature at very low pressures is an important effect that can be very beneficial for certain sputtering processes such as reactive sputtering. The increased electron temperature increases the number of metastable species in the plasma which can be useful in reactive sputtering. It also appears that the production of metastable neutral species could play a role in increasing the surface mobility of the deposited film, thereby promoting via filling. By extending the range of operating pressures to much lower levels, the present invention allows processes to control the parameter of electron temperature over a much wider range than was possible in the prior art.

Figure 6:
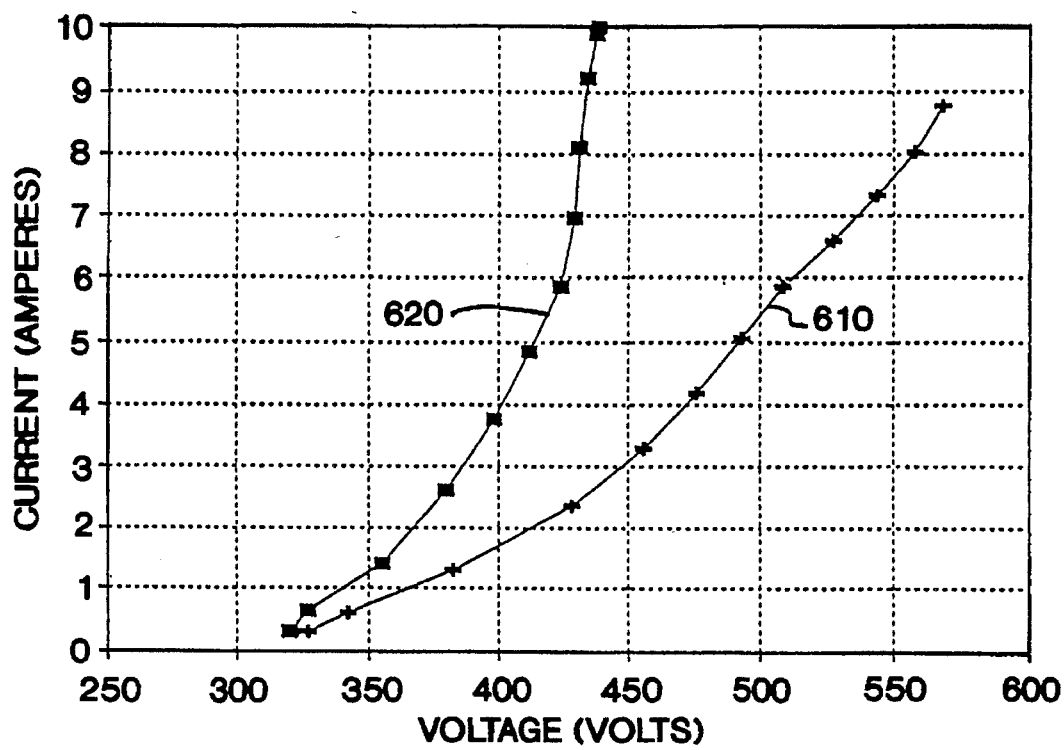
FIG. 6 is a graph comparing the voltage/current characteristics of sputtering systems with and without a bucking magnet according to the present invention.

FIG. 6 is a graph of the voltage/current characteristics of a sputtering system with and without a bucking magnet of the present invention. The operating pressure of the sputtering system was 1.0 millitorr in both instances, near the lower limit of operating pressure for a system without a bucking magnet. Curve 610 represents data measured without a bucking magnet while curve 620 depicts the data collected when a bucking magnet was deployed. It is apparent from FIG. 6 that the use of a bucking magnet according to the present invention substantially reduces the impedance of the plasma discharge, thereby enabling better coupling of power into the plasma over a very wide range of operating conditions. This result provides an added benefit to the present invention which is useful even when operating at pressures that were possible using the prior art system design.

Figure 8:
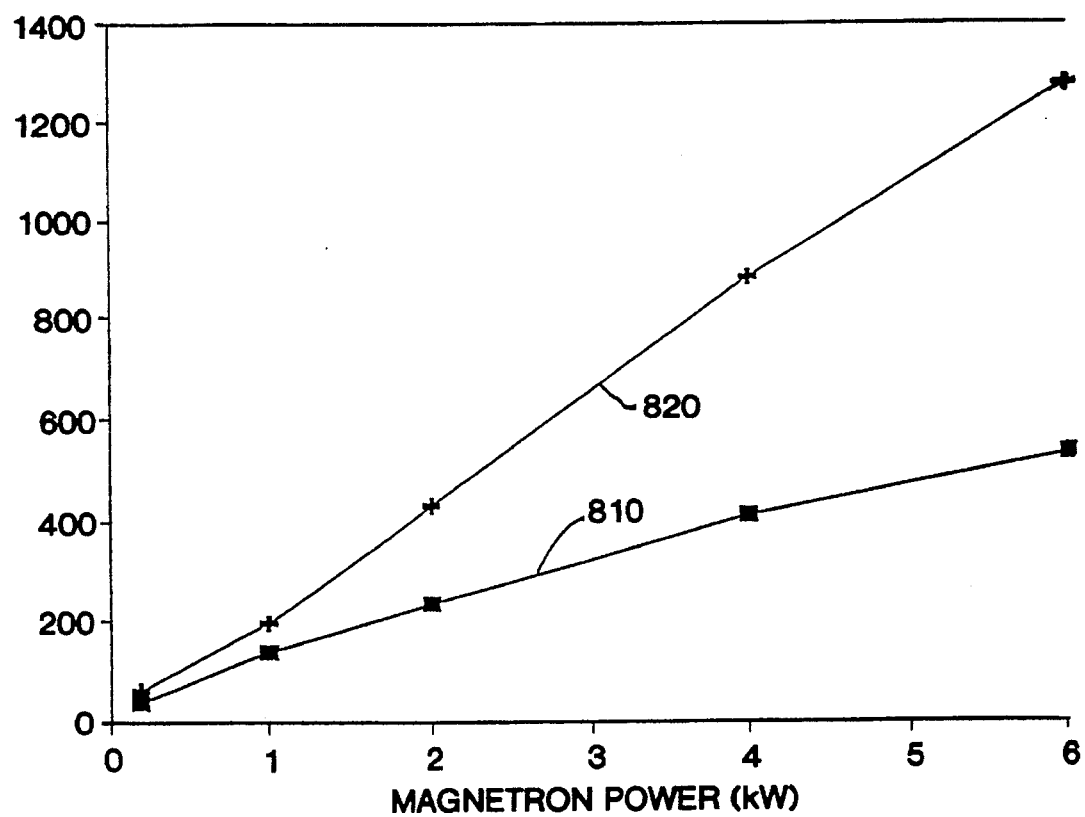
FIG. 8 is a graph of plasma light intensity vs. power comparing sputtering systems with and without a bucking magnet according to the present invention.

FIG. 8 is a graph of measured plasma light intensity versus magnetron power in a sputtering system, comparing results obtained with and without a bucking magnet. Curve 810 represents data measured without a bucking magnet while curve 820 depicts the data collected when a bucking magnet was deployed. (In both cases, the system was operated at a pressure of 2.0 millitorr.) It is apparent from FIG. 6 that use of a bucking magnet provides greater power coupling to the plasma so that for a given power input, a plasma of substantially greater intensity is created.

It is believed that the data shown in FIGS. 6 and 8 reflect significantly improved electron trapping with the bucking magnet design of the present invention.

The low pressure operation made possible by the present invention has particular utility when used with collimated sputtering. As noted above, collimated sputtering requires that there be no substantial gas scattering between the exit of the collimation filter and the substrate being coated. Gas scattering is caused by collisions between the sputtered atoms and atoms or ions of the support gas. As is well known, the mean free path of the sputtered atoms (i.e., the mean distance traveled between collisions) is inversely related to the operating pressure, so that by reducing the operating pressure the mean free path can be substantially increased. This, in turn, allows for increased separation between the substrate and the collimation filter. Such increased separation may be desired for several reasons. For example, if a collimation filter is placed too close to a substrate it can produce a visibly noticeable shadow on the deposited film. Likewise, it has been observed that lowering the pressure and, therefore, the amount of scattering, tends to reduce the problem of the flaking of deposited film from the collimator. With less scattering, more of the atoms sputtered from the target reach the substrate, so that the overall deposition rate is increased and target utilization is increased.

Lower operating pressure also has the advantage of allowing the use of increased vacuum pumping speeds during system operation. This, in turn, reduces gas contamination and particulate production.

Finally, it has been observed that there is often a relationship between the stress in a film deposited by sputtering and the deposition pressure. By increasing the range of pressures that can be used during sputter coating, the present invention enables control over film stress over a wider range.

While the present invention has been described with reference to the preferred embodiments thereof, those skilled in the art will appreciate that there are many modifications and equivalents of what has been shown. Therefore, it is intended that the invention be limited only by the following claims.

What is claimed is:

1. A magnetron sputtering system for depositing a selected material onto a substrate, said system comprising:

a chuck for holding a generally flat wafer-type substrate disposed generally in a first plane, said substrate having a first surface on which the selected material is to be deposited facing outwardly from said chuck;

a single, generally dish-shaped sputter target having a front surface disposed generally in a second plane and comprising a selected material to be sputtered and a back surface, said dish-shaped target having a perimeter, said second plane being substantially parallel to said first plane and separated therefrom by a fixed distance while said system is in operation;

a first closed-loop magnet means positioned proximate said sputter target back surface for creating a closed-loop magnetic tunnel adjacent to said sputter target front surface, said first closed-loop magnet means having inner and outer edges relative to a central axis of said dish-shaped sputter target and having opposite magnetic polarities at said inner and outer edges, said first closed-loop magnet means comprising a plurality of magnets each having a first magnetic pole and a second magnetic pole of opposite magnetic polarity to said first pole, each of said magnets having a magnetic polar axis passing through both said first pole and said second pole, each said polar axis disposed generally in a third plane generally parallel to said second plane;

a second closed-loop magnet means positioned proximate said sputter target perimeter, said second closed-loop magnet means having inner and outer edges relative to said central axis and having opposite magnetic polarities at said inner and outer edges, said second closed-loop magnet means comprising a plurality of bucking magnets each having a first magnetic pole and a second magnetic pole of opposite magnetic polarity to said first pole, each of said bucking magnets having a magnetic polar axis passing through both said first pole and said second pole, each said polar axis disposed generally in a fourth plane generally parallel to said third plane, the magnetic polarity at the inner edge of said second closed-loop magnet means being the same as the magnetic polarity of said outer edge of said first closed-loop magnet means such that the magnetic field generated by said second closed-loop magnet means prevents said closed-loop magnetic tunnel from intersecting said sputter target perimeter, and the magnetic field intensity generated by each of said bucking magnets being fixed during operation of the system.

2. The sputtering system of claim 1 wherein said first closed-loop magnet means is rotatable about an axis which passes through said sputter target.

3. The sputtering system of claim 2 wherein said first closed-loop magnet means is generally heart-shaped.

4. The sputtering system of claim 3 wherein said first closed-loop magnet means has a cross section which is substantially constant over substantially the entire loop.

5. The sputtering system of claim 2 wherein said magnetic tunnel has a narrow cross section.

6. The sputtering system of claim 1 wherein said sputter target is planar.

7. The sputtering system of claim 1 wherein said sputter target is concave.

8. The sputtering system of claim 1 wherein said sputter target perimeter is substantially circular.

9. The sputtering system of claim 8 wherein said second closed-loop magnet means is substantially circular and has a diameter which is greater than the diameter of said sputter target.

10. A magnetron sputtering system for depositing a selected material onto a generally flat semiconductor substrate, said system comprising:

a chuck for holding the generally flat semiconductor substrate disposed generally in a first plane, said substrate having a first surface on which the selected material is to be deposited facing outwardly from said chuck;

a single, generally dish-shaped sputter target having a front surface comprising a material to be sputtered and a back surface, said front surface having a generally circular peripheral edge generally defining a second plane, said second plane being substantially parallel to said first plane and separated therefrom by a fixed distance while said system is in operation;

a first closed-loop magnet assembly rotatable about an axis which passes through said second plane, said first closed-loop magnet assembly having an upper surface generally defining a third plane that is generally coplanar with said second plane and an outer edge relative to said axis of rotation, said outer edge of said first closed-loop magnet having a single magnetic polarity while said sputtering system is in operation, said first closed-loop magnet assembly comprising a plurality of magnets each having a first magnetic pole and a second magnetic pole of opposite magnetic polarity to said first pole, each of said magnets having a magnetic polar axis passing through both said first pole and said second pole thereof, each said polar axes disposed generally in a fourth plane generally parallel to said third plane; and a second stationary, fixed intensity, generally annular closed-loop magnet assembly having a diameter greater than the diameter of said sputter target, said second closed-loop magnet assembly having an upper surface defining a fifth plane that is generally coplanar with said second plane, and an inner edge which is generally adjacent to said peripheral edge of said sputter target, said inner edge of said second closed-loop magnet assembly having the same magnetic polarity as the outer edge of said first closed-loop magnet assembly while said sputtering system is in operation, said second closed-loop magnet assembly comprising a plurality of bucking magnets each having a first magnetic pole and a second magnetic pole of opposite magnetic polarity to said first pole, each of said bucking magnets having a magnetic polar axis passing through both said first pole and said second pole, each said polar axis disposed generally in a sixth plane generally parallel to said fifth plane;

wherein said first and second closed-loop magnet assemblies cooperate to confine the plasma discharge within said sputtering system to the region adjacent to said front surface of said sputter target, such that there is no substantial contact between said plasma and said semiconductor substrate.

11. The sputtering system of claim 10 wherein the plane defined by said second closed-loop magnet upper surface is closer to said substrate than the plane defined by said first closed-loop magnet.

12. A method of sputtering a selected material onto a generally flat substrate in a conventional magnetron sputtering system, said method comprising:

positioning a generally flat semiconductor substrate within a vacuum chamber in a generally opposing relationship to a sputter target having a dish-shaped front surface;

creating a plasma within said vacuum chamber proximate to said front surface;

rotating a first magnet assembly positioned behind said front surface to confine said plasma to a region adjacent to said front surface;

positioning a second magnet assembly of generally annular shape and having a constant magnetic field intensity and polarity adjacent to an outer edge of said front surface to prevent said plasma from spreading out beyond the edge of said front surface when said vacuum chamber is operated at low pressure;

sputtering the selected material within said vacuum chamber at a low pressure in a range of about 0.1 millitorr to about 4.0 millitorr;

whereby said first and second magnets cooperate to prevent said plasma from contacting said substrate.

* * * * *